United States Patent [19]
Zommer

[11] Patent Number: 4,677,452
[45] Date of Patent: Jun. 30, 1987

[54] POWER FIELD-EFFECT TRANSISTOR STRUCTURES

[75] Inventor: Nathan Zommer, San Jose, Calif.

[73] Assignee: Intersil, Inc., Cupertino, Calif.

[21] Appl. No.: 767,052

[22] Filed: Aug. 16, 1985

Related U.S. Application Data

[63] Continuation of Ser. No. 314,800, Oct. 26, 1981, abandoned.

[51] Int. Cl.⁴ ............ H01L 29/78; H01L 27/02; H01L 27/10; H01L 29/06
[52] U.S. Cl. ............ 357/23.4; 357/23.8; 357/41; 357/45; 357/55; 357/65
[58] Field of Search ............ 357/23.4, 23.8, 41, 357/45, 55, 65, 68, 71

[56] References Cited

U.S. PATENT DOCUMENTS

| | | | |
|---|---|---|---|
| 3,783,349 | 1/1974 | Beasome | 357/23 VD X |
| 4,055,884 | 11/1977 | Jambotkar | 29/571 |
| 4,148,047 | 4/1979 | Hendrickson | 357/22 X |
| 4,152,714 | 5/1979 | Hendrickson et al. | 357/22 X |
| 4,355,320 | 10/1982 | Tihangi | 357/23 VD X |
| 4,376,286 | 3/1983 | Lidow et al. | 357/41 |
| 4,412,242 | 10/1983 | Herman et al. | 357/52 |

FOREIGN PATENT DOCUMENTS 2072422 9/1981 United Kingdom .

OTHER PUBLICATIONS

J. Fagenbaum, "Advances in Extending Performance of Power MOS Field-effect Transistors Promise to Extend Their Usefulness...", vol. 18, No. 1, Jan. 1981, pp. 64-65, *IEEE Spectrum*.

*Primary Examiner*—J. Carroll
*Attorney, Agent, or Firm*—Spensley Horn Jubas & Lubitz

[57] ABSTRACT

A power field-effect transistor device includes a source electrode metallization layer having windows to reduce interlayer capacitance and shorting between the source electrode and gate electrode layers. An alternative embodiment has source bus expanded areas for accommodating the source electrode layer contacts, which are orthogonally placed to facilitate the construction of the device.

4 Claims, 4 Drawing Figures

POWER FIELD-EFFECT TRANSISTOR STRUCTURES

The present application is a continuation application of parent application Ser. No. 314,800, filed Oct. 26, 1981, now abandoned.

BACKGROUND OF THE INVENTION

1. Field of the Invention

The present invention relates to field-effect transistors, and more particularly, to structures for power field-effect transistors.

The metal-oxide-semiconductor field-effect transistor (MOSFET) generally has a gate electrode or bus which is separated from a semiconductor material by an insulating layer. The gate electrode, which is often made of polysilicon, is disposed over a channel in the semiconductor material defined by the drain, gate and source regions of the device. A second insulating layer is deposited on the gate electrode, and a metal such as aluminum is evaporated over the second insulating layer to form a source electrode metallization layer. In order to provide contact to the source regions of the semiconductor material, openings are provided in the gate electrode and insulating layers so that a portion of the metal is also deposited at various locations on the source regions.

A single power MOSFET generally has a single large drain region formed by the semiconductor substrate and an epitaxial layer on the substrate. Within the semiconductor epitaxial layer are a large number of gate regions, with a source region located within each gate region. The gate electrode also often has a plurality of individual areas, each of which is disposed over the semiconductor between adjacent source regions. Each gate electrode area is often referred to as a gate bus. The metallization layer contacts each source region thereby interconnecting the source regions. The gate busses are also interconnected so that the individual source and gate regions operate in parallel. Thus, the device can, in effect, operate as a single MOS transistor.

2. Description of the Prior Art

The source electrode layer in prior art devices typically covers most of the main active area of the transistor device in a continuous layer. This results in a significant parasitic gate-to-source capacitance, which increases the turn-on and turn-off times as well as the current drive needed to switch the device. In addition, the insulating layer between the gate electrode and the source metal layer must provide a high degree of isolation over the large area of the source electrode layer. Imperfections such as pinholes or photomasking defects occurring during contact opening in the isolation layer can lead to eventual gate to source shorts. That is, during the metallization process, a metal bridge can be formed between the source electrode layer and the underlying gate electrode layer through an imperfection in the insulating layer, shorting the source and gate electrode layers.

Another disadvantage associated with prior art power MOSFET devices relates to the "on resistance" ($R_{on}$) of the devices. The on resistance of a power MOSFET device is determined in part by the width of the individual gate electrode busses between the source regions. Generally, the higher the on resistance of a MOSFET device, the greater its power dissipation.

The source regions of the power transistors are generally formed in relatively narrow parallel lines with each line often referred to as a source bus. Each source bus has a plurality of expanded areas for accommodating the contact pads of the source electrode layer. The expanded areas of previous devices often have shapes such as octagons and hexagons. Since each gate bus follows the outline of adjacent source busses, the expanded areas of the source busses operate to reduce the effective width of the gate busses. Also, the expanded areas of previous devices consume a large amount of space, which reduces the available packing density of the source busses.

In order to minimize the narrowing of the effective width of each gate bus, previous devices have been constructed so that the expanded areas adjacent source busses are interleaved. The interleaved structure complicates the generation of the masks used to construct the device and does not readily lend itself to a repetitious (step and repeat) computer-controlled generation procedure.

SUMMARY OF THE INVENTION

It is an object of the present invention to provide an improved power field-effect transistor device which requires less switching time and less energy for turn-on.

It is another object of the present invention to provide a power field-effect transistor device which requires less chip area than prior art designs while maintaining equivalent on resistance and breakdown voltage ratings.

It is still another object of the present invention to provide a power field-effect device which has an improved production yield and is easier to manufacture than prior art devices.

The present invention is directed to a field-effect transistor having a gate electrode and a source electrode metallization layer which has a plurality of spaced windows in the source electrode layer. This structure results in reduced capacitance between the source electrode layer and the gate electrode. Furthermore, the danger of shorting between the source electrode layer and the gate electrode is also reduced.

In another aspect of the present invention, the semiconductor material of the device includes a source region having rectangular-shaped expanded areas for accommodating source electrode contacts, and a plurality of narrower source areas for interconnecting the expanded areas. The rectangular shape of the expanded areas allows the area of the semiconductor material consumed by the expanded subregion to be reduced, thus enabling the packing density of the source busses to be increased without reducing the effective gate width of each gate electrode bus.

An alternative embodiment of the present invention provides an orthogonal arrangement of the expanded source areas to facilitate the generation of a mask to be used in manufacturing the transistor device.

BRIEF DESCRIPTION OF DRAWING

The invention will be described with reference to the attached drawings, wherein like numerals refer to like elements.

DETAILED DESCRIPTION OF THE DRAWINGS

Figure 1:
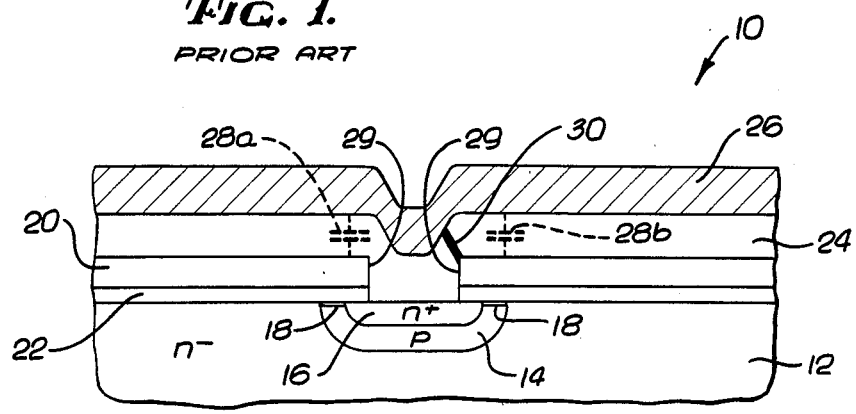
FIG. 1 is a cross-sectional view of a power MOSFET device of the prior art.

FIG. 1 shows a cross-section of a single transistor element of a power MOSFET device of the prior art. The device 10 has an epitaxial layer (or epilayer) which may be doped as n−, for example, to form a drain region 12. A gate region 14 is diffused into the drain region 12, with a third region or source region 16 diffused into the gate region. If the drain region is doped as n−, the gate and source regions are typically doped as p and n+, respectively. A channel 18 on each side of the source region 16 is defined from the source region 16 across the gate region 14 to the drain region 12. A gate electrode 20, often composed of n-type polysilicon, is disposed over the channel 18 of the device 10, and an insulating layer 22 isolates the gate electrode 20 from the channel 18. The device 10 has a second insulating layer 24 which isolates a metallization layer 26 from the gate electrode 20. The metallization layer forms the source electrode layer and is formed by evaporating a metal such as aluminum over the surface of the insulating layer 24. The insulating layer 24 may be composed of thermal silicon dioxide, CVD silicon dioxide, silicon nitride or some other dielectric. The source electrode layer 26 contacts the source region 16 through openings (not shown in the cross-section of FIG. 1) in the insulating layer 24.

In prior art devices, the source electrode layer 26 generally covers most of the active area of the MOSFET device in one continuous layer. Due to the large extent of the source electrode layer 26, a relatively large parasitic capacitance develops between the source electrode layer 26 and the gate electrode 20, as represented by the capacitors 28a and 28b indicated by broken lines. The large extent of the source electrode layer 26 further requires a high degree of perfection in the isolation provided by the insulating layer 24 over a relatively large area. Imperfections in the insulating layer 24, such as pinholes and photomasking defects, can lead to a metal bridge being formed between the source electrode layer 26 and the gate electrode 20. This danger is especially enhanced in the areas of the device 10 where the vertical walls of the gate electrode 20 are found. An example of one such metal bridge shorting the source electrode layer 26 and the gate electrode 20 in the vicinity of the gate electrode walls 29 is indicated at 30.

Figure 2:
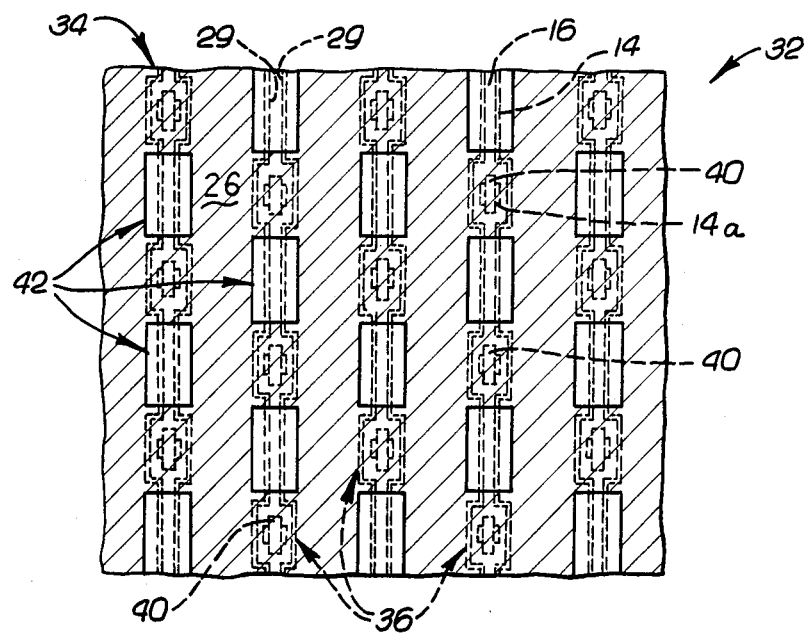
FIG. 2 is a planar view of a transistor device of the present invention, with underlying portions indicated by broken lines.
Figure 3:
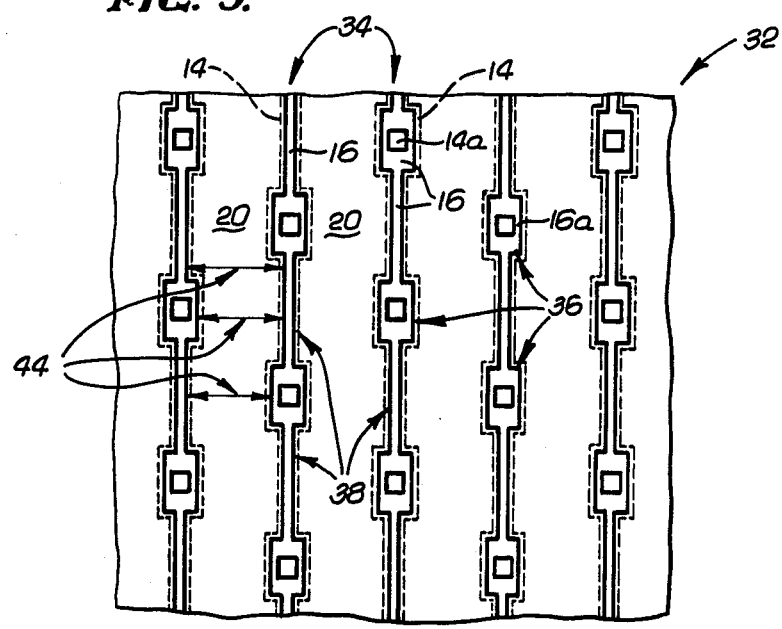
FIG. 3 is a planar view of the underlying portions of the device of FIG. 2 with the metallization and insulating layers omitted.

Referring now to FIGS. 2 and 3, a portion of a power MOSFET device 32 is shown which employs a preferred embodiment of the present invention. FIG. 3 shows the device 32 of FIG. 2 with the source electrode layer 26 and insulating layer 24 removed to clarify the description of the underlying structure. The transistor device 32 has a plurality of parallel source busses 34, each of which comprises a source region 16 diffused into a gate region 14 (which in turn is diffused into a drain region not visible). A plurality of gate electrodes 20 are disposed over the semiconductor material between adjacent source busses 34. Each gate electrode 20 may also be referred to as a gate bus. Each source bus 34 has a plurality of expanded areas 36, which are interconnected by narrow areas 38 between the expanded areas 36. The expanded areas 36 are provided to accommodate a contact 40 (FIG. 2) between the source regions 16 and the source electrode layer 26. The contacts 40 of the source electrode layer 26 are formed in openings provided in the insulative layers above the expanded areas 36. The expanded areas 36 of each source bus 34 are formed so that a small region 14a of the gate region 14 remains within the source expanded areas 36. The contact 40 also makes contact to the small gate region 14a of the gate region 14 thereby shorting the source region 16 to the gate region 14 within the vicinity of each expanded area 36. Shorting the source region to the gate region reduces parasitic bipolar transistor action since it prevents the shorted gate region from operating as a base region.

In accordance with the present invention, as shown in FIG. 2, the source electrode layer 26 of the device 32 includes a plurality of windows or openings 42 where there is no metallization over the insulating layer 24. By providing the windows 42, the parasitic interlayer capacitance between the source electrode layer 26 and the gate electrode 20 is correspondingly reduced. Furthermore, the danger of shorting between the source electrode layer 26 and the gate electrode 20 through imperfections in the insulating layer 24 especially at vertical wall regions 29 is also reduced. Each window 42 is shown preferably centered over the narrow portion 38 of the source busses 34 to minimize the presence of the source electrode layer over the vertical walls 29 of the gate electrode 20. This further reduces the danger of shorting, which is higher in the vicinity of the vertical walls 29.

Depending upon the thickness of the layer 26, from 20% to 40% of the source electrode layer 26 may be removed to form windows. The greater the thickness of the source electrode layer 26, the larger the windows 42 may be without unduly increasing the resistance of the source electrode layer 26.

While the openings 42 are preferably described and shown as windows, other shapes of openings in the metalized source electrode 26 may be employed. While windows provide a continuous current path in the remaining metal of the source electrode, in some devices this is not a requirement and the removed metal of the electrode can be in the form of stripes, ribs and other shapes.

As seen most clearly in FIG. 3, the shape of the gate electrode 20 generally follows the outline of the adjacent source busses 34. The effective width of the gate electrode 20 is a function of the size of the expanded areas 36 and narrow areas 38 as well as the spacing between the source busses 34, as indicated by arrows 44. Furthermore, the effective gate width can also be a function of the shape of the expanded areas. The expanded areas 36 of the illustrated embodiment are rectangular in shape. In comparison, the expanded areas of the source busses of many previous devices are shaped as octagons or hexagons. These shapes, while accommodating similar sized source electrode contacts, typically occupy more chip area than the rectangular expanded areas 36 of the illustrated embodiment.

Thus, the rectangular shaped expanded areas 36 allow a wider effective gate width per unit chip area than with previous designs. Consequently, the source busses 34 may be constructed more closely together without reducing the effective gate width of the gate electrodes 20.

The power consumed by a power MOSFET device is generally a function of the on resistance of the device.

The on resistance of the device is determined in part by the effective width of each gate electrode. As previously mentioned, the effective gate width is a function of the size of the expanded areas 36. In the illustrated embodiment, the expanded areas 36 of the source regions 16 each have a width of 12 microns. This width has been found to provide adequate space to accommodate the contacts 40 of the source electrode layer 26 while minimizing the reduction of the effective gate width caused by the presence of the expanded areas 36.

The gate regions 14a within the expanded areas 36 have also been reduced in size as compared to previous designs. As a result, the gate regions 14a occupy a smaller space within the expanded areas 36, which allows a wider source region 16a at the periphery of the gate region 14a. This improves the current injection into the gate region 14. Accordingly, the total current flow of the device is improved, thus reducing the on resistance and increasing the transconductance, $g_m$. The gate regions 14a within the expanded areas 36 of the source region 16 have dimensions of approximately 6 microns by 6 microns in the illustrated embodiment.

Another advantage of the illustrated embodiment resides in the spacing between the expanded areas 36 along each source bus 34. In the illustrated embodiment, the spacing has been reduced to a distance of fifty-eight microns from the center of one expanded area 36 to the center of the adjoining expanded area 36 along each source bus 34. This increases the frequency per unit area of the expanded areas 36 and hence, also the frequency per unit area of the source electrode contacts 40 to further reduce the parasitic bipolar action of the device 32.

In addition, the high frequency of expanded areas 36 increases the total periphery of the source region 16 which further improves the transconductance, $g_m$. These improvements in the transconductance are important for power MOSFET devices, particularly for the lower breakdown voltage devices (such as those below 200 volts) where the on resistance is significantly affected by the channel resistance. Accordingly, an improvement in the transconductance can also result in a significant improvement in the on resistance of the device.

Figure 4:
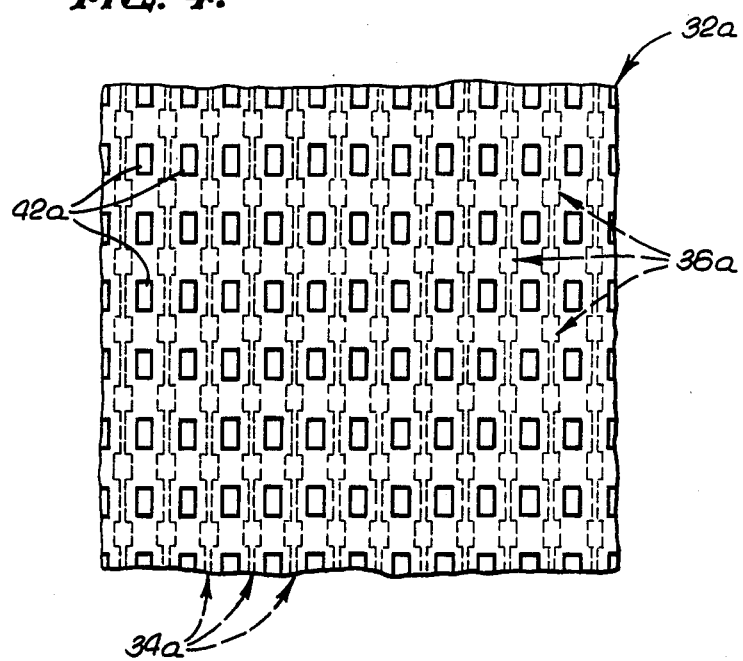
FIG. 4 is a planar view of an alternative embodiment of the device of FIG. 2.

In the device 32 of FIG. 2, the expanded areas 36 of adjacent source busses 34 are nonorthogonal staggered array to minimize the narrowing of the gate electrode 20. However, it has been found that this nonorthogonal structure is not necessary for power MOSFET devices having a relatively high breakdown voltage, such as those exceeding a 200 volt breakdown voltage, for example. FIG. 4 shows an alternative embodiment of the device of FIG. 2. The device has a plurality of source busses 34a which include expanded areas 36a that are orthogonally arranged rather than nonorthogonal arrangement as in the device in FIGS. 2 and 3.

The orthogonal arrangement of the expanded areas 36a of the device of FIG. 4 facilitates simplified construction of the device. The pattern of the source and gate regions of the device are generally masked onto the device. The masks used in the masking operations are often generated by automated procedures using a computer. The orthogonal arrangement of FIG. 4 facilitates the use of "step and repeat" masking operations. Furthermore, since the expanded areas 36a are orthogonally arranged, the windows 42a of the device may also be orthogonally arranged to further facilitate simplification and automation of the manufacturing processes. An additional advantage of the orthogonal arrangement shown in FIG. 4 is that the spacing between the source electrode contacts on the expanded areas 36a is reduced as compared to an nonorthogonal pattern. As a result, the current conduction in the source electrode layer is improved.

It is apparent from the foregoing that the transistor devices of the present invention have improved performance characteristics and require less semiconductor chip area than previous designs having the equivalent on resistance, transconductance and breakdown voltage ratings. The improved performance characteristics include a faster switching time and less driving energy required to turn the device on, as a result of the reduction in the interlayer capacitance. The windows or openings of no metallization in the source electrode layer further improve the production yield of the manufactured devices by reducing the opportunity for interlayer shorting. An improved production yield lowers the manufacturing cost of the devices.

It will, of course, be understood that modifications of the present invention, in its various aspects, will be apparent to those skilled in the art, some being apparent only after study and others being merely matters of routine semiconductor design. Other embodiments are also possible with their specific design depending upon the particular application. As such, the scope of the invention should not be limited by the particular embodiments herein described but should be defined only by the appended claims and equivalents thereof. Various features of the invention are set forth in the following claims.

I claim:

1. A power field-effect transistor comprising:

a semiconductor substrate and an epitaxial layer on the substrate, said epitaxial layer having drain, gate and source regions which define an active area of the transistor, said gate region having a channel from the source region, through the gate region, to the drain region, said drain region further including the substrate;

a first insulative layer disposed on the epitaxial layer;

a gate electrode layer disposed on the first insulative layer over the channel and having a plurality of openings over the source region; and a second insulative layer disposed on the gate electrode layer; and a metallization layer insulatively disposed over the gate electrode and forming a source electrode having an array of contacts, each contact extending through the insulative layers and the gate electrode layer openings to the source region, said metallization layer having a plurality of spaced openings, each opening having closed periphery and being positioned between adjacent contacts and over at least a portion of the source region wherein the interlayer capacitance and the danger of shorting between the metallization layer and the gate electrode layer are reduced.

2. The transistor of claim 1 wherein the gate electrode layer has vertical walls defining the openings in the gate electrode layer, and each of said source electrode layer openings of closed periphery is located over at least a portion of the gate electrode vertical walls, wherein the danger of shorting between the gate electrode layer and the metallization layer is reduced.

3. The transistor of claim 2 wherein the total area of the closed periphery openings is over approximately 20 to 40 percent of said active area of the transistor.

4. A field-effect transistor comprising:
a semiconductor substrate and an epitaxial layer which together form a drain region, wherein a plurality of gate regions are diffused into the drain region and a source region is diffused into each of the gate regions, each source region including an array of expanded areas and a plurality of narrower areas interconnecting the expanded areas;

a gate electrode layer insulatively disposed on the semiconductor material; and a source electrode metallization layer insulatively disposed on the gate electrode layer and forming contacts to the source expanded areas, said source electrode layer having an array of windows of no metallization, each window being located between adjacent contacts and over the associated narrower source area between the source expanded areas of the contacts;

wherein the likelihood of shorts between the source and gate electrode layers and the interlayer capacitance are both reduced.

* * * * *